(12) United States Patent
Cho et al.

(10) Patent No.: US 12,104,247 B2
(45) Date of Patent: Oct. 1, 2024

(54) APPARATUS FOR TRAPPING MULTIPLE REACTION BY-PRODUCTS FOR SEMICONDUCTOR PROCESS

(71) Applicant: MILAEBO CO., LTD., Pyeongtaek-si (KR)

(72) Inventors: Che Hoo Cho, Seoul (KR); Yeon Ju Lee, Osan-si (KR); Jin Woong Kim, Osan-si (KR); Ji Eun Han, Pyeongtaek-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 670 days.

(21) Appl. No.: 17/377,202

(22) Filed: Jul. 15, 2021

(65) Prior Publication Data

US 2022/0349052 A1    Nov. 3, 2022

(30) Foreign Application Priority Data

Apr. 28, 2021   (KR) .................. 10-2021-0055004

(51) Int. Cl.
*C23C 16/44* (2006.01)
*B01D 45/04* (2006.01)
*B01D 45/08* (2006.01)

(52) U.S. Cl.
CPC .......... *C23C 16/4412* (2013.01); *B01D 45/04* (2013.01); *B01D 45/08* (2013.01); *C23C 16/4401* (2013.01); *C23C 16/4411* (2013.01); *B01D 2258/0216* (2013.01)

(58) Field of Classification Search
None
See application file for complete search history.

(56) References Cited

U.S. PATENT DOCUMENTS

2020/0164296 A1* 5/2020 Cho ................ B01D 45/16
2020/0321226 A1* 10/2020 Cho ................ C23C 16/4412

FOREIGN PATENT DOCUMENTS

| KR | 10-0717837 B1 | 5/2007 |
| KR | 10-0862684 B1 | 10/2008 |
| KR | 20-2011-0006874 U | 7/2011 |
| KR | 10-1447629 B1 | 10/2014 |
| KR | 10-1806480 B1 | 1/2018 |
| KR | 10-2020-0062901 A | 6/2020 |

* cited by examiner

*Primary Examiner* — Jason M Greene
(74) *Attorney, Agent, or Firm* — You & IP, LLC

(57) ABSTRACT

The present disclosure relates to an apparatus for trapping multiple reaction by-products for a semiconductor process, in which in order to separate, with the single trapping apparatus, reaction by-product mixtures contained in unreacted gases discharged after a process of depositing multiple different thin film layers is performed in a process chamber during a semiconductor manufacturing process, a trapping region division part is provided, which divides a heat distribution region into trapping regions for respective reaction by-products while controlling a flow in a movement direction of an introduced unreacted gas, thereby trapping a reaction by-product aggregated in the form of a thin film in a relatively high-temperature region by using a first internal trapping tower in a front region, and trapping a reaction by-product aggregated in the form of powder in a relatively low-temperature region by using a second internal trapping tower in a rear region.

14 Claims, 12 Drawing Sheets

APPARATUS FOR TRAPPING MULTIPLE REACTION BY-PRODUCTS FOR SEMICONDUCTOR PROCESS

CROSS-REFERENCE TO RELATED APPLICATIONS

This application claims the priority of Korean Patent Application No. 10-2021-0055004 filed on Apr. 28, 2021, in the Korean Intellectual Property Office, the disclosure of which is incorporated herein by reference.

BACKGROUND

Field

The present disclosure relates to an apparatus for trapping multiple reaction by-products for a semiconductor process, and more particularly, to an apparatus for trapping multiple reaction by-products, the apparatus being capable of trapping a reaction by-product mixture contained in an unreacted gas discharged after multiple thin-film deposition processes are performed in a process chamber during a semiconductor manufacturing process, and the apparatus being capable of trapping the reaction by-product mixture in the form of a thin film or powder suitable for a trapping temperature region in the single trapping apparatus.

Description of the Related Art

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting required process gases such as silane, arsine, boron chloride, hydrogen, nitrogen, and gaseous water, and process gases such as precursor gas required for deposition of the thin film into a process chamber through a gas injection system. In this case, various types of non-deposited reaction by-products, unreacted ignitable gases, and harmful gases containing corrosive foreign substances and toxic substances are produced in large amount in the process chamber.

For this reason, in order to purify and discharge unreacted gases discharged from the process chamber, a semiconductor manufacturing apparatus has a scrubber installed at a rear end of a vacuum pump for creating a vacuum in the process chamber, and the scrubber purifies the unreacted gases discharged from the process chamber and discharges the purified gas into the atmosphere.

However, because the scrubber purifies and processes only gaseous reaction by-products, the reaction by-products contained in the unreacted gases, which are discharged without being used for the deposition in the process chamber, adhere to pipes if particulate reaction by-products containing in the unreacted gases discharged from the process chamber are not trapped in advance. As a result, there is a problem in that an exhaust pressure is increased, the vacuum pump is broken down as the particulate reaction by-products enter the vacuum pump, or the particulate reaction by-products flow back into the process chamber and contaminate wafers.

For this reason, a reaction by-product trapping apparatus, which may have various structures, is installed between the process chamber and the vacuum pump in the semiconductor manufacturing apparatus in order to aggregate the unreacted gases discharged from the process chamber.

However, in the case of the by-product trapping apparatus in the related art, because the reaction by-products contained in the discharged unreacted gases are produced in the form of reaction by-product mixtures when multiple deposition processes for depositing different thin films are performed in the process chamber, temperatures at which the by-products are aggregated are different from one another. For this reason, there is a problem in that it is structurally difficult to efficiently trap the reaction by-products by the single trapping apparatus.

Therefore, trapping apparatuses, which are configured to trap the reaction by-product mixtures in different temperature regions, need to be provided to trap the reaction by-product mixtures contained in the unreacted gases. For this reason, there are problems in that an additional trapping apparatus needs to be provided, and a temperature controller is required to adjust and make the trapping temperature region suitable for the reaction by-product to be trapped, which complicates the entire process apparatus and the process control.

Accordingly, there is a need to develop a reaction by-product trapping apparatus capable of solving the above-mentioned problems.

SUMMARY

An object to be achieved by the present disclosure is to provide an apparatus for trapping multiple reaction by-products for a semiconductor process, in which in order to separate, with the single trapping apparatus, the reaction by-product mixtures contained in the unreacted gases discharged after a process of depositing multiple different thin film layers is performed in a process chamber during a semiconductor manufacturing process, a trapping region division part is provided, which divides a heat distribution region into trapping regions for respective reaction by-products while controlling a flow in a movement direction of an introduced unreacted gas, thereby trapping a reaction by-product aggregated in the form of a thin film in a relatively high-temperature region by using a first internal trapping tower in a front region, and trapping a reaction by-product aggregated in the form of powder in a relatively low-temperature region by using a second internal trapping tower in a rear region.

According to an aspect of the present disclosure, an apparatus for trapping multiple reaction by-products for a semiconductor process is configured to trap a reaction by-product mixture contained in an unreacted gas discharged after multiple thin-film deposition processes are performed in a process chamber during a semiconductor manufacturing process, and the apparatus includes: a trapping region division part positioned in a housing and configured to divide a heat distribution region by controlling a flow of the unreacted gas introduced and heated by the hot/cold heater; a first internal trapping tower positioned in a front region of the trapping region division part and configured to trap the reaction by-product, which reacts at a relatively high temperature, in the form of a thin film from the reaction by-product mixtures contained in the introduced unreacted gas; and a second internal trapping tower positioned in a rear region of the trapping region division part and configured to trap the reaction by-product, which reacts at a relatively low temperature, in the form of powder from the reaction by-product mixtures contained in the introduced unreacted gas in a space region in which a relatively lower temperature is maintained than the front region, in which the reaction by-product mixtures contained in the unreacted gas are separated and trapped by dividing the region in the single apparatus.

According to the present disclosure, the housing may include: a housing main body having a gas inlet port formed in a transverse direction and configured to accommodate the introduced unreacted gas; an upper plate having a gas discharge port installed in an upward direction and having a hole-type gas guide part protruding from a lower portion of the upper plate; a lower plate configured to fasten and support the trapping region division part, the first internal trapping tower, and the second internal trapping tower; and a coolant flow path part installed on the upper plate and configured to cool the upper plate and the housing to adjust outer surface temperatures of the upper plate and the housing.

According to the present disclosure, the hot/cold heater may be configured such that an external coolant tube of the coolant flow path part is connected to a lower coolant flow path that surrounds a periphery of a power tube connected to a power supply part, such that a coolant performs thermal conduction while circulating to adjust an outer surface temperature of the housing.

According to the present disclosure, the apparatus may further include a flow path switching plate positioned above the trapping region division part and configured to trap the remaining reaction by-product contained in the unreacted gas by switching and extending a flow path direction of the gas have passed through the second internal trapping tower.

According to the present disclosure, the apparatus may further include a mesh type trapping part configured to trap the remaining reaction by-product contained in the unreacted gas discharged upward through one point region of the flow path switching plate and then discharge only the unreacted gas through a gas discharge port of an upper plate.

According to the present disclosure, the trapping region division part may include: a front blocking plate configured to trap heat of the heated introduced unreacted gas and divide a reaction by-product trapping space by controlling a flow in a movement direction; an upper blocking plate configured to block an upward flow of the introduced unreacted gas by blocking an upper side of the front blocking plate; and a gas movement portion formed on a lower portion of the front blocking plate and configured to guide a flow of the unreacted gas downward and discharge the unreacted gas.

According to the present disclosure, the first internal trapping tower may include: a first trapping plate positioned at a front side; and a second trapping plate positioned at a point spaced apart from the first trapping plate at a predetermined interval, the first trapping plate and the second trapping plate may have one or more gas movement portions having a plurality of holes pierced in surfaces thereof to guide a flow of the introduced unreacted gas upward and downward, and the first trapping plate and the second trapping plate may have a plurality of structural trapping plates protruding forward from the surfaces thereof.

According to the present disclosure, the gas movement portions may be formed on upper, central, and lower portions of the first trapping plate, and the gas movement portion may be formed only on an upper portion of the second trapping plate to guide the flow of the unreacted gas.

According to the present disclosure, the first trapping plate may further include a plurality of structural trapping plates protruding rearward from the surface thereof.

According to the present disclosure, the structural trapping plates each may have a cross-shaped cross-section or a double-cross-shaped cross-section.

According to the present disclosure, the second internal trapping tower may include: a first trapping plate having a semicircle plate shape and having a gas movement portion having a plurality of holes pierced in one rear end region; a second trapping plate having a semicircle plate shape and having a gas movement portion having a plurality of holes pierced in one front end region; and a flat trapping plate installed between the first trapping plate and the second trapping plate stacked in an upward direction to allow the first trapping plate and the second trapping plate to be spaced apart from each other at a predetermined interval in a vertical direction and having a plurality of holes formed in a surface thereof, and the second internal trapping tower may be configured to trap the reaction by-product while switching a flow of the unreacted gas to the upward direction in a zigzag direction.

According to the present disclosure, the second internal trapping tower may be configured such that the first trapping plate is positioned at a lowermost end, and the second trapping plate is positioned at an uppermost end to extend a flow path of the introduced unreacted gas, the flat trapping plate may be installed across a central portion of the first trapping plate and a central portion of the second trapping plate in a width direction, and the flat trapping plate positioned at the uppermost end may be provided in plural.

According to the present disclosure, the flow path switching plate may include: a plate main body having a circular plate shape and configured to divide an internal space of a housing main body into an upper space and a lower space; and a gas movement portion formed in one region of the plate main body and having a plurality of pierced holes used as a passageway for the unreacted gas.

According to the present disclosure, the mesh type trapping part may include: a main body having a closed lower side, a lateral side having a mesh shape to allow the unreacted gas to be introduced thereinto, and an upper side having a mesh-shaped insertion portion having a predetermined depth and formed only at a central portion, such that the hole-type gas guide part protruding downward from the upper plate of the housing is inserted into the mesh-shaped insertion portion; and a mesh filter accommodated in the main body and configured to trap the remaining reaction by-product, which is contained in the introduced unreacted gas, in the form of powder under a low-temperature condition.

According to the apparatus for trapping multiple reaction by-products for a semiconductor process according to the present disclosure configured as described above, the trapping region division part is provided, which divides the heat distribution region into the trapping regions for the respective reaction by-products while controlling the flow in the movement direction of the introduced unreacted gas discharged after the process of depositing multiple different thin film layers is performed in a process chamber during a semiconductor manufacturing process, thereby trapping the reaction by-product aggregated in the form of a thin film in the relatively high-temperature region by using the first internal trapping tower in the front region, and trapping the reaction by-product aggregated in the form of powder in the relatively low-temperature region by using the second internal trapping tower in the rear region.

According to the apparatus for trapping multiple reaction by-products according to the present disclosure, the apparatus for a semiconductor manufacturing process and the process control are simplified, durability is also improved to the extent that the apparatus can be continuously used for six months or more, and the maintenance cycle for the vacuum pump may be reduced.

The present disclosure is a useful invention having many advantages as described above and is an invention that is highly expected to be used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of an exemplary embodiment of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
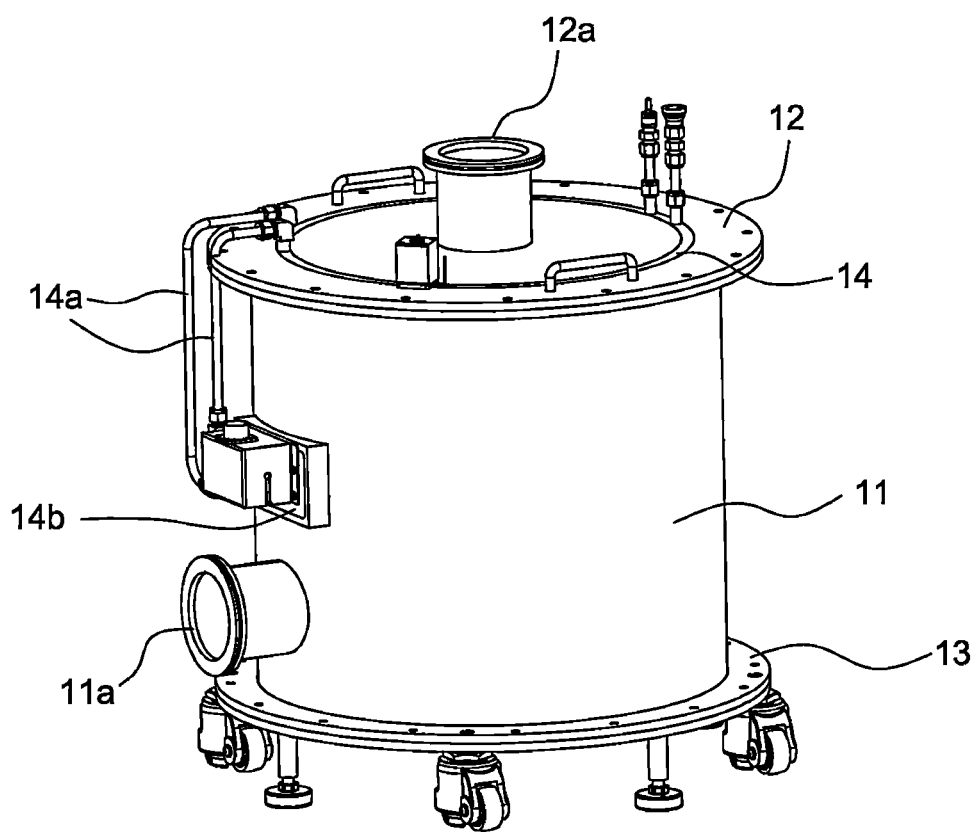
FIG. 1 is a perspective view illustrating a configuration of an apparatus for trapping multiple reaction by-products according to an embodiment of the present disclosure.
Figure 2:
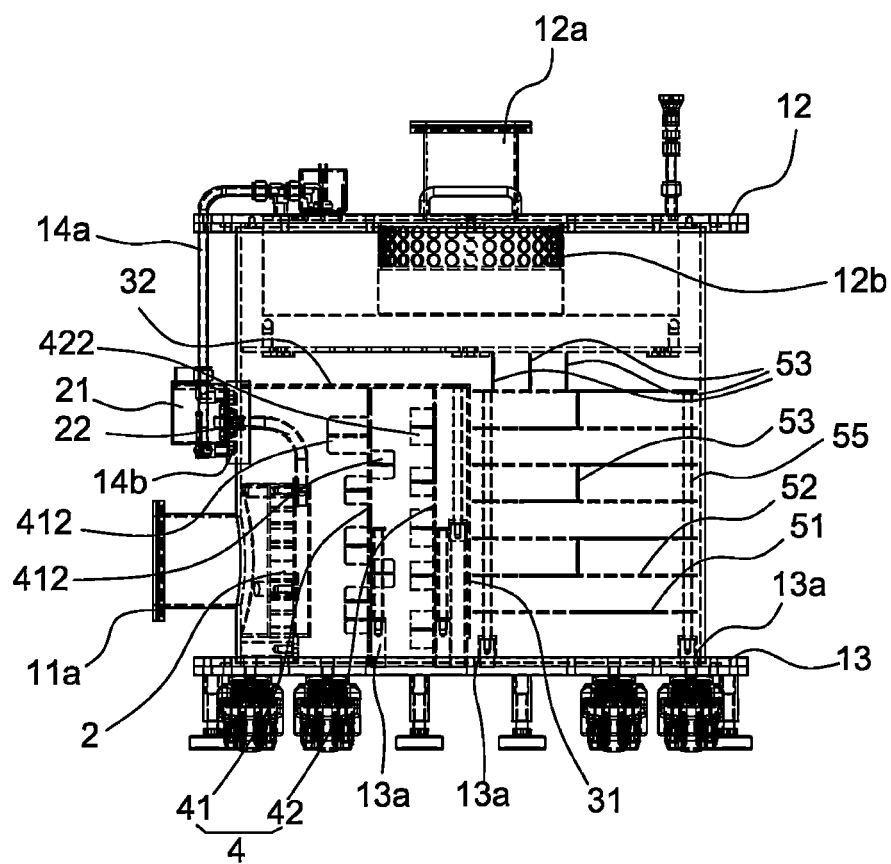
FIG. 2 is a cross-sectional view illustrating an internal configuration of the apparatus for trapping multiple reaction by-products according to the embodiment of the present disclosure.
Figure 3:
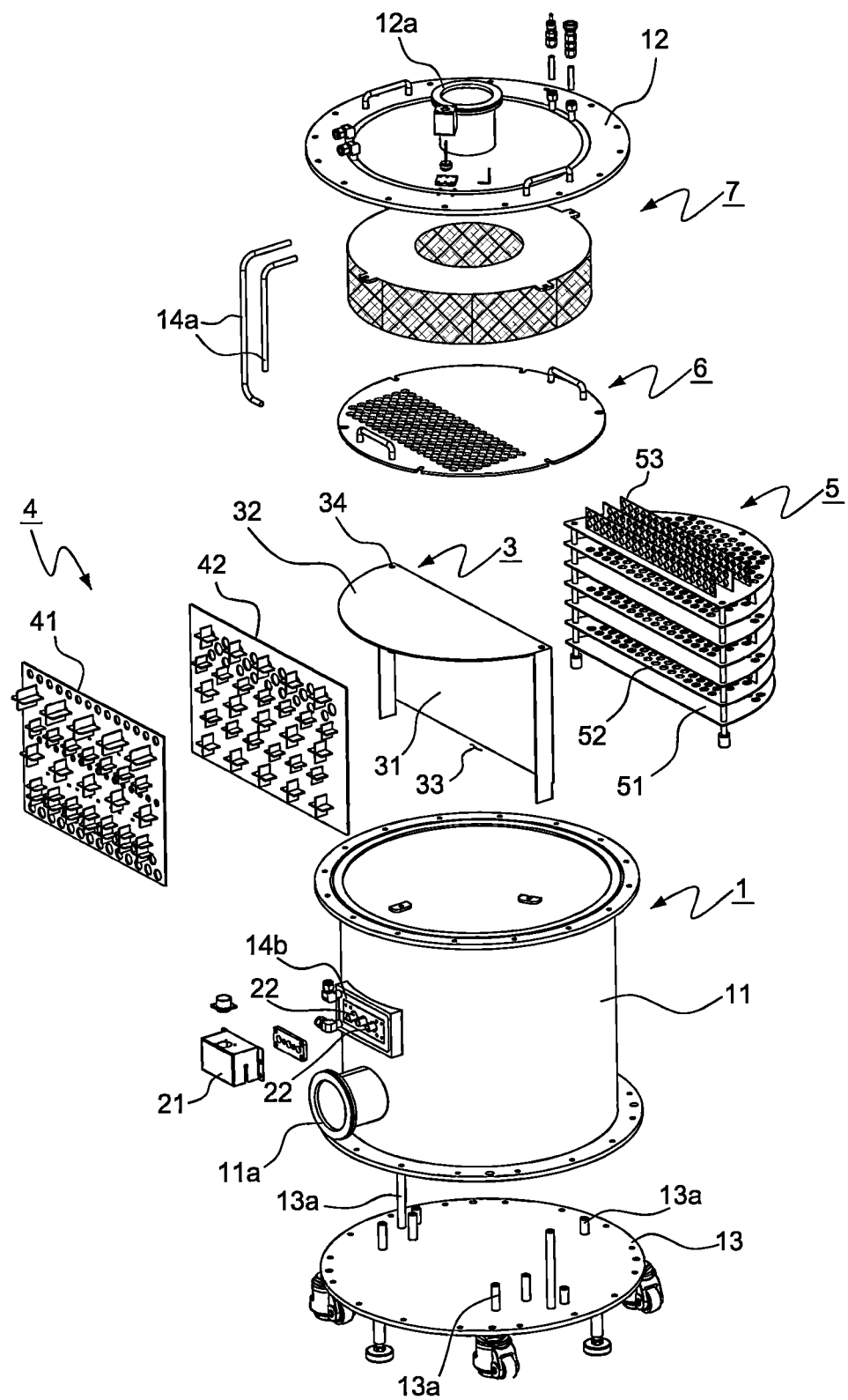
FIG. 3 is an exploded perspective view illustrating a configuration of the apparatus for trapping multiple reaction by-products according to the embodiment of the present disclosure.

FIG. 1 is a perspective view illustrating a configuration of an apparatus for trapping multiple reaction by-products according to an embodiment of the present disclosure, FIG. 2 is a cross-sectional view illustrating an internal configuration of the apparatus for trapping multiple reaction by-products according to the embodiment of the present disclosure, and FIG. 3 is an exploded perspective view illustrating a configuration of the apparatus for trapping multiple reaction by-products according to the embodiment of the present disclosure.

As illustrated, an apparatus for trapping multiple reaction by-products according to the present disclosure refers to an apparatus that separates, depending on temperature regions, reaction by-product mixtures contained in unreacted gases discharged after multiple thin-film deposition processes are performed in a process chamber (not illustrated), traps the reaction by-product mixture in the form of a thin film or powder, and then discharges only the remaining gas by means of a vacuum pump. The apparatus for trapping multiple reaction by-products includes a housing 1, a hot/cold heater 2, a trapping region division part 3, a first internal trapping tower 4, a second internal trapping tower 5, a flow path switching plate 6, and a mesh-type trapping part 7.

Hereinafter, a high temperature or a low temperature in the present disclosure means a relative temperature according to trapping temperatures for reaction by-product mixtures having different aggregation temperatures. For example, in the present disclosure, the high temperature refers to a temperature of 150° C. or more, and the low temperature refers to a temperature of 150° C. or less.

The housing 1 is configured such that an unreacted gas discharged from a process chamber is introduced and accommodated in a transverse direction and then discharged in an upward direction.

The hot/cold heater 2 is configured to adjust a temperature of the unreacted gas introduced into the housing.

The trapping region division part 3 is positioned in the housing 1 and configured to divide a heat distribution region while controlling a flow in a movement direction of the introduced unreacted gas.

The first internal trapping tower 4 is positioned in a front region of the trapping region division part 3 and configured to trap the reaction by-product, which is aggregated in the form of a thin film by reacting at a high temperature, from the reaction by-product mixtures contained in the unreacted gas introduced from a space region maintained at a temperature relatively higher than a temperature of the rear region.

The second internal trapping tower 5 is positioned in the rear region of the trapping region division part 3 and configured to trap a reaction by-product, which is aggregated in the form of powder by reacting at a low temperature, from the reaction by-product mixtures contained in the unreacted gas introduced from a space region maintained at a temperature relatively lower than a temperature of the front region.

The flow path switching plate 6 is positioned above the trapping region division part 3, extending while switching a flow path direction of the gas having passed through the second internal trapping tower 5, and configured to trap the remaining reaction by-product, which is aggregated in the form of powder by reacting at a low temperature, from the reaction by-product mixtures contained in the unreacted gas.

The mesh-type trapping part 7 is configured to trap the remaining reaction by-product, which is aggregated in the form of powder by reacting at a low temperature, from the reaction by-product mixtures contained in the unreacted gas discharged upward through one point region of the flow path switching plate 6 and then to discharge only the unreacted gas through a gas discharge port of an upper plate.

Most of the respective components may be manufactured using a material such as stainless steel or aluminum that may prevent the components from being corroded by the unreacted gas discharged from the process chamber.

The reaction by-product mixtures contained in the unreacted gas, which are trapped by the apparatus for trapping multiple reaction by-products according to the embodiment of the present disclosure described above, will be described. The reaction by-product mixtures contained in the unreacted gas, which is discharged after an oxide deposition process, i.e., a repetitive thin-film deposition process using $Al_2O_3$ and $TiO_2$ is performed in a process chamber for manufacturing a semiconductor, may include an $Al_2O_3$ reaction by-product and a $TiO_2$ reaction by-product.

For reference, an application process will be described. TMA, $N_2$ and $H_2O$ are used as gases for the $Al_2O_3$ deposition process, and $TiCl_4$, $N_2$, and $H_2O$ are used as gases for the $TiO_2$ deposition process.

Non-volatile reaction by-products are produced while the $Al_2O_3$ and $TiO_2$ deposition processes are performed using the process gases and the precursors in the process chamber, as described above. The reaction formulas related to the thin-film deposition process are as follows.

(a) $2Al(CH_3)_3 + H_2O/O_3 \rightarrow Al_2O_3 (s) + 3C_2H_{6\,(g)} \uparrow$
(b) $TiCl_4(g) + H_2O(g) \rightarrow TiO_2(s) + HCl(g) \uparrow$ Therefore, the apparatus for trapping multiple reaction by-products requires a configuration that aggregates the reaction by-product mixtures containing $Al_2O_3$ and $TiO_2$ contained in the unreacted gas by using the single trapping apparatus and forms the reaction by-product mixture in the form of a thin film or powder.

However, because the temperature regions in which the reaction by-product mixtures containing $Al_2O_3$ and $TiO_2$ are aggregated and trapped are different from each other, the apparatus for trapping multiple reaction by-products according to the present disclosure is configured to separate the spaces for trapping the reaction by-products in the form of a thin film and powder and trap heat of the unreacted gas heated by the heater, thereby simultaneously trapping $Al_2O_3$ and $TiO_2$ in the single trapping apparatus.

To this end, the apparatus is configured such that the $Al_2O_3$ reaction by-product is trapped in the form of a thin film in a high-temperature front region in which a comparatively high temperature is provided by the heater, and the $TiO_2$ reaction by-product is trapped in the form of powder in a low-temperature rear region.

In addition, the apparatus includes an efficiently trapping configuration in order to maximally trap the reaction by-product mixtures remaining before a flow path is expanded and the reaction by-product mixtures are discharged.

Hereinafter, the respective components will be described more specifically.

Figure 4:
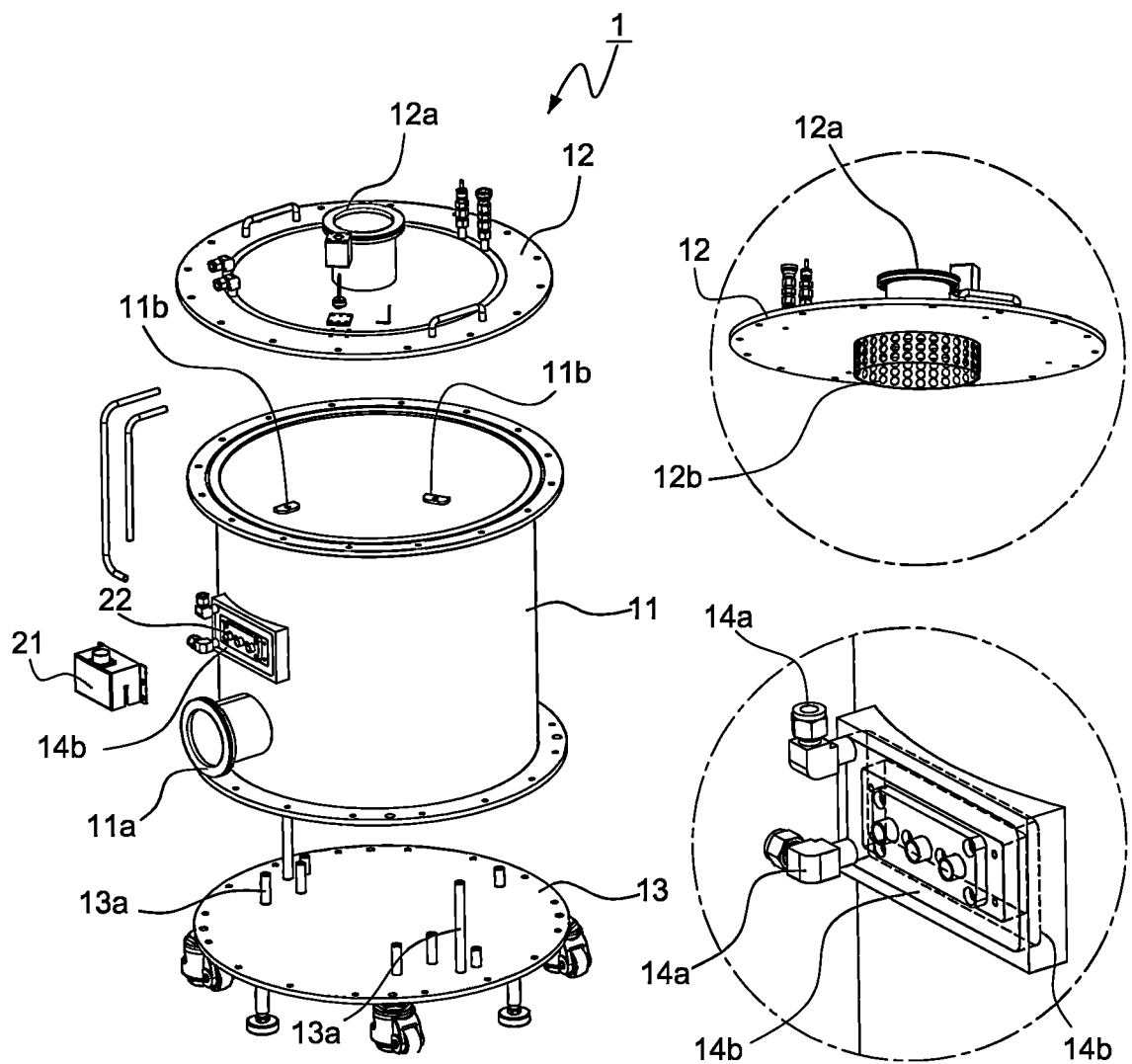
FIG. 4 is a perspective view illustrating configurations of a housing and a heater according to the embodiment of the present disclosure.

FIG. 4 is a perspective view illustrating configurations of the housing and the heater according to the embodiment of the present disclosure.

As illustrated, the housing 1 includes: a housing main body 11 configured to receive the introduced unreacted gas and having a gas inlet port 11a formed in a transverse direction; an upper plate 12 having a gas discharge port 12a installed in an upward direction and having a hole-type gas guide part 12b predicting from a lower portion of the upper plate 12; a lower plate 13 configured to fasten and support the trapping region division part 3, the first internal trapping tower 4, and the second internal trapping tower 5; and a coolant flow path part 14 installed on the upper plate 12 and configured to cool the upper plate and the housing to adjust outer surface temperatures of the upper plate and the housing.

In addition, the hot/cold heater 2 is installed in the housing main body to provide heat in the transverse direction. An external coolant tube 14a of the coolant flow path part 14 installed on the upper plate 12 of the housing is connected to a lower coolant flow path 14b formed in the form of a groove-structured flow path on the hot/cold heater 2 installed on an outer portion of the housing main body 11 to circulate a coolant, thereby adjusting the outer surface temperature of the housing main body.

In the embodiment, the housing main body 11, the upper plate 12, and the lower plate 13 are illustrated as each having a cylindrical shape, but the present disclosure is not limited to the above-mentioned shape, and a necessary shape such as a quadrangular column shape or a polygonal column shape may be applied. However, for convenience of description, the present disclosure will be described with reference to the configuration in which the housing main body 11, the upper plate 12, and the lower plate 13 each have a cylindrical shape.

The housing main body 11 has a vacant housing shape and serves to store the introduced unreacted gas so that the reaction by-product mixture contained in the unreacted gas introduced into the trapping region division part 3, the first internal trapping tower 4, the second internal trapping tower 5, the flow path switching plate 6, and the mesh-type trapping part 7, which are installed in the housing main body, is aggregated and trapped in the form of a thin film or powder.

The gas inlet port 11a installed on the housing main body 11 in the transverse direction allows the flow of the introduced unreacted gas to have a gas flow which is supplied in a horizontal direction and discharged to the gas discharge port 12a formed on the upper plate 12 in the upward direction. A joint portion of the gas inlet port may be processed along a lateral shape of the housing main body having a curvature and then fixed by welding or other well-known fastening methods. The installation positions may be variously set, but particularly, the gas inlet port may be set to match a trapping plate and a gas flow path of the first internal trapping tower 4 installed in the housing main body.

In addition, a power supply part 21 is installed on the outer portion of the housing main body 11 to supply power to the hot/cold heater 2 to control the temperature. In this case, the external coolant tube 14a of the coolant flow path part 14 is provided on the outer portion of the housing main body and connected to the coolant flow path part 14b formed in the form of a groove-structured circulation flow path on the power supply part 21 of the hot/cold heater 2 to circulate the coolant, thereby adjusting the outer surface temperature of the housing main body.

In addition, a plurality of support pieces 11b is provided along an inner wall of the housing main body 11 to mount and fix the flow path switching plate 6. In the illustrated embodiment, an example is described in which bolts are fastened to the support pieces along a plurality of fastening grooves formed along a periphery of the flow path switching plate 6. However, various well-known fastening methods including welding may be applied in addition to the above-mentioned method.

The upper plate 12 serves as a cover for covering an upper side of the housing main body 11 opened at the upper side thereof. The upper plate 12 discharges the unreacted gas, from which the reaction by-product mixtures are trapped, to the vacuum pump through the gas discharge port 12*a*. In this case, the hole-type gas guide part 12*b* installed on and protruding from the lower portion of the upper plate 12 is inserted into a central portion of the mesh-type trapping part 7, such that the unreacted gas has passed through the mesh-type trapping part positioned around the hole-type gas guide part 12*b* is guided to the gas discharge port protruding from the central portion of the upper plate.

In addition, the coolant flow path part 14 is processed in the form of a groove in an upper surface of the upper plate 12 in order to provide an appropriate temperature region when trapping the reaction by-products in the upper region of the housing main body and prevent deformation of a non-illustrated O-ring installed on the lower portion of the upper plate when an internal space of the housing main body 11 is heated. In this case, the upper portion of the coolant flow path part having the groove is covered by a flow path cover. In this case, although not illustrated, the flow path cover may be fastened by sealing for liquid tightness, and well-known fastening methods such as fitting, welding, and bolting may be applied.

The lower plate 13 serves to cover an opened lower side of the housing main body 11, and support portions 13*a* protrude from an upper surface of the lower plate 13 and fix the first internal trapping tower 4, the second internal trapping tower 5, and the flow path switching plate 6 positioned on the upper portion of the lower plate 13. As a fixing method, the first internal trapping tower 4, the second internal trapping tower 5, and the trapping region division part 3 may be thread-fastened to the support portions by inserting fastening rods into fastening portions or fastening holes formed in the first internal trapping tower 4, the second internal trapping tower 5, and the trapping region division part 3. Various well-known fastening methods such as a fitting method or a welding method may of course be applied as an example of the fastening method.

Mobile wheels or the like may be installed on the lower surface of the lower plate so that the trapping apparatus may be conveniently moved to a necessary position. Of course, the lower plate may be fixed to a frame or a floor surface in a factory, such that the lower plate may be configured as a stationary lower plate.

The coolant flow path part 14 is provided on the upper plate 12 and includes a coolant inlet port and a coolant discharge port to circulate, supply, and discharge the coolant, which is supplied from an external coolant tank (not illustrated), through the coolant flow path formed on the upper plate.

In addition, the coolant flow path part 14 is configured such that the external coolant tube 14*a* is connected to the coolant flow path 14*b* formed and positioned in the form of a groove structure on a lower portion of the power supply part 21 for protecting an electric wire for supplying power to the hot/cold heater 2, thereby circulating the coolant and then discharging the coolant through the coolant discharge port. The cover is sealed to prevent a coolant leakage when the coolant circulates in the groove structure of the coolant flow path 14*b*.

Since the coolant flow path is organically connected to the hot/cold heater to circulate the coolant, as described above, it is possible to prevent the surface of the housing from being heated by the high-temperature heater.

In addition, the coolant flow path part 14 formed on the upper plate has a boundary portion that prevents the coolant, which is introduced through the coolant inlet port 13 and then is to be discharged through the coolant discharge port 14, from being mixed with the introduced coolant.

Water or a refrigerant may be used as the coolant used for the coolant flow path part.

The hot/cold heater 2 generates heat by being supplied with power from the power supply part 21, and a diffuser structure (diffusion structure) provided in the heater heats the unreacted gas introduced through the gas inlet port 11*a* installed on the housing main body 11 in the transverse direction.

Meanwhile, the hot/cold heater 2 is configured such that the external coolant tube 14*a* of the coolant flow path part 14 is connected to the lower coolant flow path 14*b* that surrounds a power tube 22 connected to the power supply part 21, such that the coolant performs thermal conduction while circulating, thereby adjusting the outer surface temperature of the housing main body.

The hot/cold heater 2 is attached and installed, by a fastening method such as bolting or welding, to the inner wall of the housing main body so as to be parallel to the gas inlet port 11*a* installed to communicate with the housing main body 11. A heat source of the hot/cold heater 2 generates heat at a predetermined temperature when power is applied to a power line in the power tube. A material such as ceramic or Inconel is used as the material of the hot/cold heater 2 in order to prevent corrosion caused by the introduced gas.

With the hot/cold heater 2 configured as described above, the unreacted gas discharged from the process chamber is introduced through the gas inlet port 11*a* and reaches the first internal trapping tower 4 without being aggregated, and a solid reaction by-product is trapped in the form of a thin film as the reaction by-product mixture contained in the unreacted gas is reacted and aggregated at a relatively high temperature.

Figure 5:
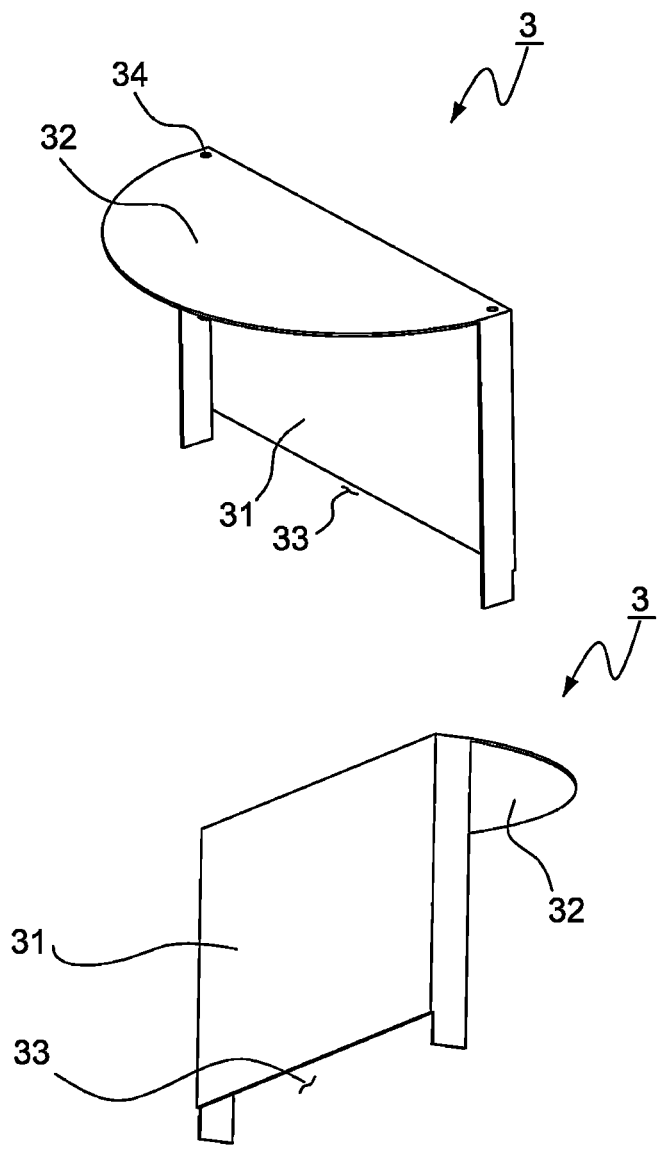
FIG. 5 is a perspective view illustrating a configuration of a trapping region division part according to the embodiment of the present disclosure.

FIG. 5 is a perspective view illustrating a configuration of the trapping region division part according to the embodiment of the present disclosure.

As illustrated, the trapping region division part 3 includes: a front blocking plate 31 configured to trap heat of the unreacted gas heated by the hot/cold heater 2 and then introduced, control a flow in the movement direction of the unreacted gas, and divide the reaction by-product trapping space; an upper blocking plate 32 configured to block an upper side of the front blocking plate to block an upward flow of the introduced unreacted gas; and a gas movement portion 33 formed at a lower side of the front blocking plate 31 and configured to guide and discharge the flow of the unreacted gas to the lower side of the front blocking plate 31.

The front blocking plate 31 may be provided in the form of a quadrangular plate having a horizontal width corresponding to an inner diameter of the housing main body, and thus the front blocking plate 31 may perform a sealing function.

The upper blocking plate 32 has a semi-circular shape having a diameter corresponding to the inner diameter of the housing main body, and thus the upper blocking plate 32 is configured to seal an upper side of the front region made by dividing the trapping space with the front blocking plate 31.

In addition, the upper blocking plate may have fastening holes 34 and be thread-fastened to the support portions by inserting the fastening rods into the support portions 13a formed on the lower plate 13. Various well-known fastening methods such as a fitting method or a welding method may of course be applied as an example of the fastening method.

The gas movement portion 33 is provided to discharge the unreacted gas containing the remaining reaction by-product to the lower side after the reaction by-product is trapped in the form of a thin film under a relatively high-temperature environment from the reaction by-product mixtures contained in the unreacted gas while moving through the first internal trapping tower 4 installed in the front region of the front blocking plate. In this case, the gas movement portion may be provided in the form of an opening in order to smoothly discharge the gas while reducing a load caused by a flow power of the gas introduced from the gas inlet port. However, the gas movement portion may include a plurality of holes.

Figure 6:
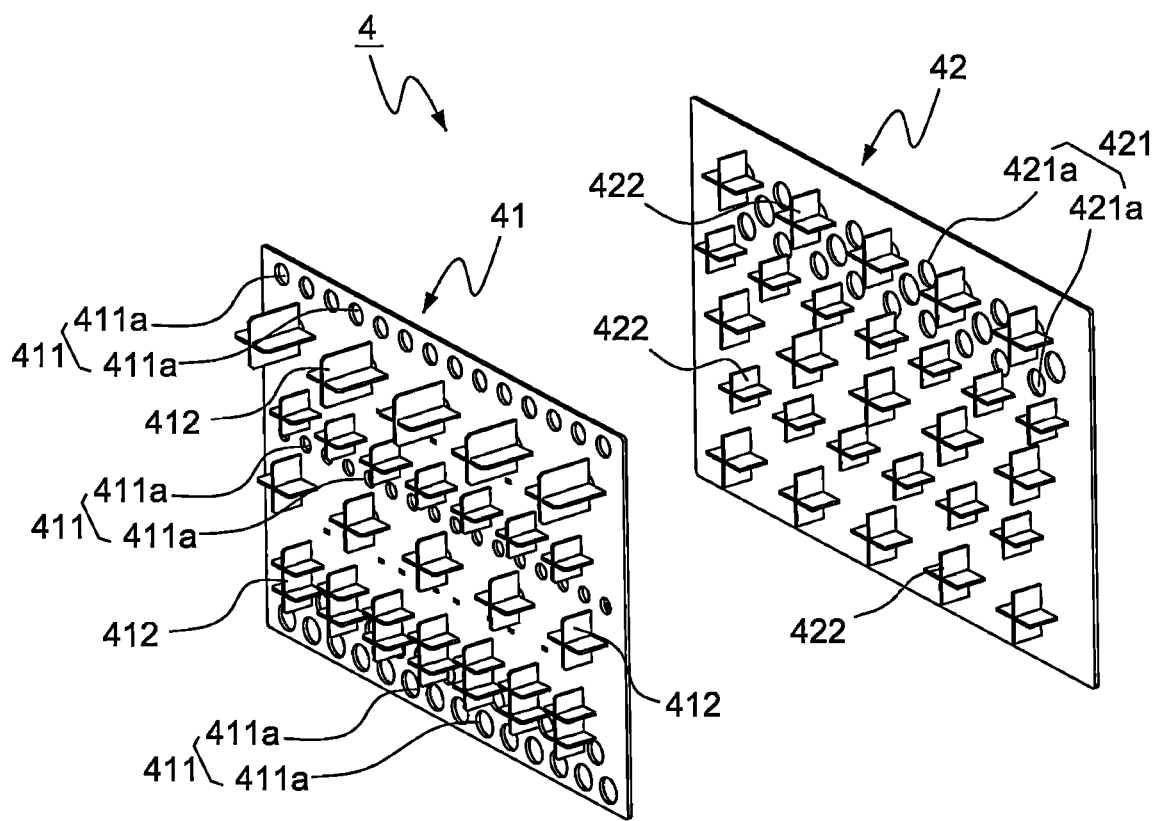
FIG. 6 is a perspective view illustrating a configuration in one direction of a first internal trapping tower according to the embodiment of the present disclosure.
Figure 7:
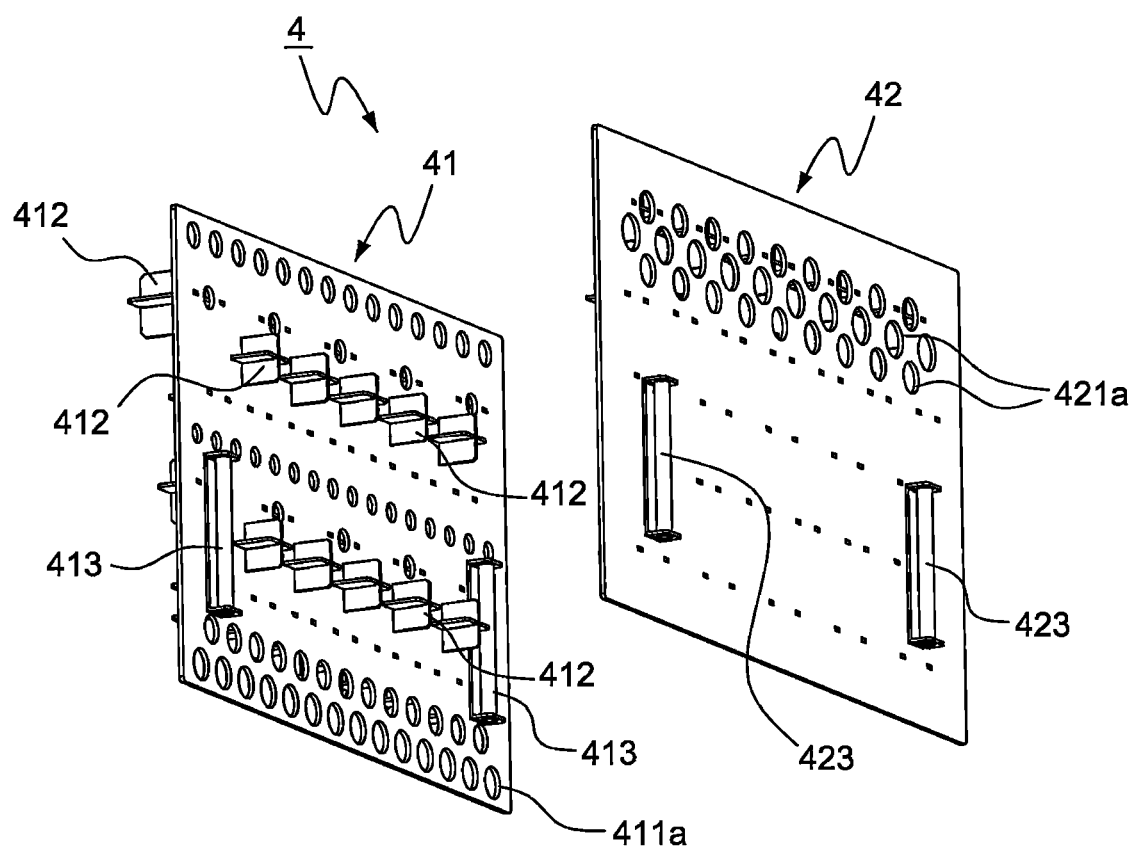
FIG. 7 is a perspective view illustrating a configuration in the other direction of the first internal trapping tower according to the embodiment of the present disclosure.

FIG. 6 is a perspective view illustrating a configuration in one direction of the first internal trapping tower according to the embodiment of the present disclosure, and FIG. 7 is a perspective view illustrating a configuration in the other direction of the first internal trapping tower according to the embodiment of the present disclosure.

As illustrated, the first internal trapping tower 4 includes one or more trapping plates positioned in the front region made by dividing the trapping region with the trapping region division part 3 depending on the temperature. The trapping plates face the introduced unreacted gas and are provided in the horizontal direction to trap the reaction by-product in the form of a thin film in the high-temperature region from the reaction by-product mixtures contained in the unreacted gas while guiding the gas flow.

In the embodiment, the present disclosure includes a first trapping plate 41 positioned at the front side, and a second trapping plate 42 positioned at a point spaced apart from the first trapping plate 41 at a predetermined interval, thereby trapping the reaction by-product on the surfaces of the first trapping plate 41 and the second trapping plate 42.

The first trapping plate 41 and the second trapping plate 42 each include gas movement portions 411 and 421 provided in the form of plurality of holes 411a and 421a pierced in the surfaces of the first trapping plate 41 and the second trapping plate 42. The gas movement portions 411 and 421 are formed in one or more regions to guide the flow of the introduced unreacted gas in the vertical direction, extend the residence time, and provide a large amount of reaction time, thereby trapping the reaction by-product in the form of a thin film.

In the embodiment, the gas movement portions 411 may be formed in upper, central, and lower portions of the first trapping plate 41, and a larger number of holes 411a may be formed in the lower portion of the first trapping plate 41. The flow of the gas may be concentrated on the upper portion of the second trapping plate 42 by the holes formed in the upper portion of the second trapping plate 42. In this case, vortices are less generated due to a difference in flow velocity caused by imbalance of the gas flow path, and a temperature decrease deviation may be increased, which may degrade the trapping performance. Therefore, the gas movement portions may be formed in the upper, central, and lower portions of the first trapping plate.

In addition, in the embodiment, the gas movement portion 421 may be formed only in the upper portion of the second trapping plate 42. Since the gas movement portions are formed as described above, the upward gas flow of the unreacted gas may be guided by the main flow formed at the lower side of the first trapping plate 41, and a gas flow path length is increased, such that a gas residence time is increased, and efficiency in generating vortices by a difference in flow velocity is improved, thereby improving trapping efficiency. The hole 421a formed in the upper gas movement portion 421 of the second trapping plate 42 may be relatively larger than the hole formed in the first trapping plate 41 to prevent the load of the unreacted gas.

The first trapping plate 41 and the second trapping plate 42 each have a plurality of structural trapping plates 412 and 422 protruding forward from the surfaces thereof.

In addition, the first trapping plate 41 may further include a plurality of structural trapping plates 412 protruding rearward from the surface thereof. With the above-mentioned configuration, the generation of the vortices is increased between the structural plates 412 formed on the rear surface of the first trapping plate 41 and the structural plates 52 formed on the front surface of the second trapping plate 42, thereby improving efficiency in trapping the reaction by-product.

The structural trapping plates 412 and 422 each may have a cross-shaped cross-section or a double-cross-shaped cross-section having a vortex generation structure to increase a wide surface area per unit area and trapping time in order to transmit the reaction by-product mixture contained in the introduced unreacted gas with high efficiency.

In addition, the structural trapping plates 412 and 422 formed on the front surface are larger in number than the structural trapping plates 412 formed on the rear surface, thereby allowing the structural trapping plates 412 and 422 formed on the front surface to mainly trap the reaction by-product mixture.

The trapping operation of the first internal trapping tower 4 is performed by the front surfaces, the rear surfaces, and the structural trapping plates 412 and 422 of the first trapping plate 41 and the second trapping plate 42.

Fastening portions 413 and 423 are formed on the rear surfaces of the first trapping plate 41 and the second trapping plate 42 and fastened to the support portions 13a formed on the lower plate of the housing. The fastening portions 413 and 423 may be thread-fastened to the support portions by inserting the fastening rods into the fastening portions 413 and 423. Various well-known fastening methods such as a fitting method or a welding method may of course be applied as an example of the fastening method.

The first internal trapping tower 4, configured as described above, is positioned in the front region of the trapping region division part 3 and traps the reaction by-product, which is aggregated in the form of a thin film by reacting at a high temperature, from the reaction by-product mixtures contained in the unreacted gas while moving the flow of the introduced unreacted gas upward and downward in the space region kept at a temperature relatively higher than a temperature of the rear region. The trapping operation of the first internal trapping tower 4 may be performed with high efficiency by the front surfaces, the rear surfaces, and the structural trapping plates 412 and 422 of the first trapping plate 41 and the second trapping plate 42.

Figure 8:
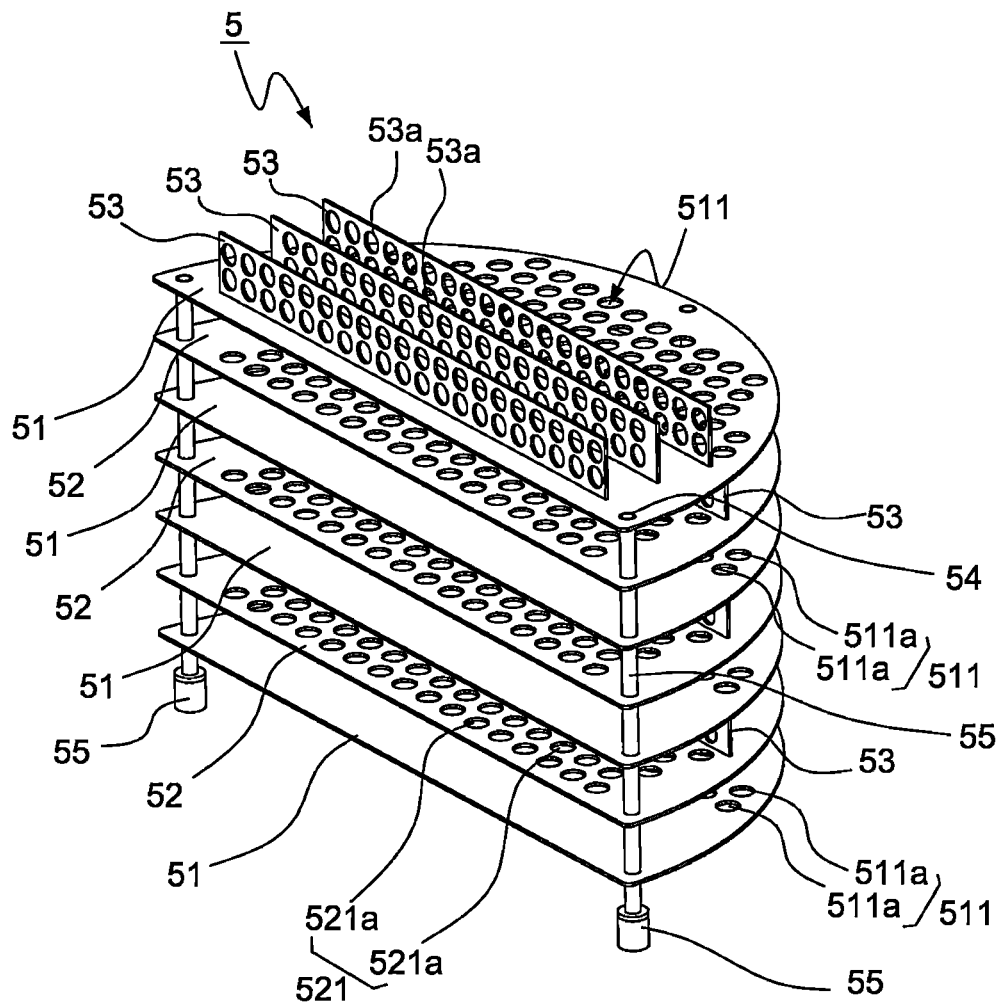
FIG. 8 is a perspective view illustrating a configuration in one direction of a second internal trapping tower according to the embodiment of the present disclosure.
Figure 9:
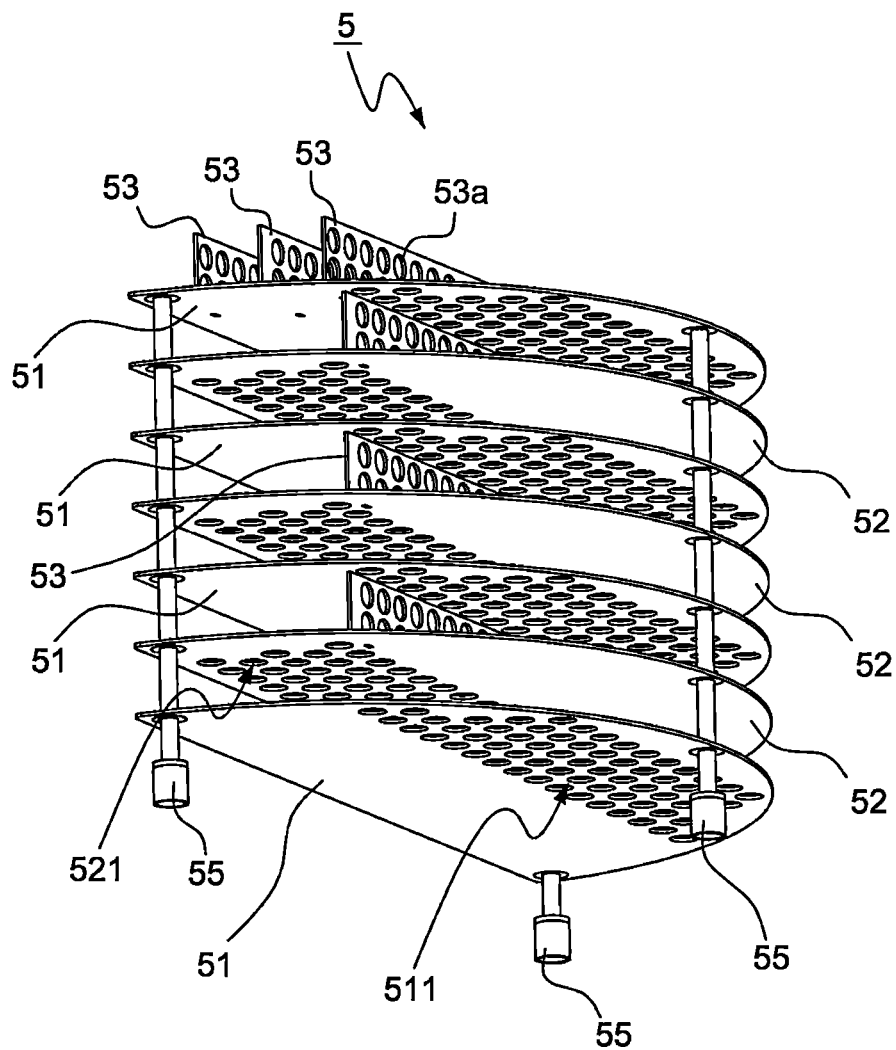
FIG. 9 is a perspective view illustrating a configuration in the other direction of the second internal trapping tower according to the embodiment of the present disclosure.

FIG. 8 is a perspective view illustrating a configuration in one direction of the second internal trapping tower according to the embodiment of the present disclosure, and FIG. 9 is a perspective view illustrating a configuration in the other direction of the second internal trapping tower according to the embodiment of the present disclosure.

As illustrated, the second internal trapping tower 5 includes a plurality of flat trapping plates each having a semicircle plate shape, stacked in the vertical direction, and spaced apart from one another at predetermined intervals. The plurality of trapping plates is positioned in the rear region made by dividing the trapping region with the trapping region division part 3 depending on the temperature. The plurality of trapping plates faces the introduced unreacted gas and traps the reaction by-product in the form of powder in the low-temperature region from the reaction by-product mixtures contained in the unreacted gas while switching the gas flow in a zigzag direction and guiding the gas flow.

In the embodiment of the present disclosure, based on a semicircle plate shape having a front end as a line segment and a rear end as an arc shape, the trapping plates include: first trapping plates 51 each having a semicircle plate shape having a gas movement portion 511 having a plurality of holes 511*a* pierced in one rear end region; second trapping plates 52 each having a semicircle plate shape having a gas movement portion 521 having a plurality of holes 521*a* pierced in one front end region; and flat trapping plates 53 each installed between the first trapping plate 51 and the second trapping plate 52 stacked in the upward direction to allow the first trapping plate 51 and the second trapping plate 52 to be spaced apart from each other at a predetermined interval in the vertical direction and having a plurality of holes 53*a* pierced in the surface thereof.

With the aforementioned configuration, the gas movement portions 511 and the gas movement portions 521 are alternately positioned in the vertical direction in a zigzag direction, thereby guiding the flow of the unreacted gas.

Particularly, the first trapping plate 51 having the semicircle plate shape and the gas movement portion 511 having the plurality of holes 511*a* pierced in one rear end region is positioned at the lowermost end, and the second trapping plate having the semicircle plate shape and the gas movement portion 521 having the plurality of holes 521*a* pierced in one front end region is positioned at the uppermost end. With the above-mentioned configuration, the flow path of the unreacted gas introduced to the lower side through the lower gas movement portion 33 of the trapping region division part 3 extends to a maximally distant point, and the unreacted gas moves along the flow path and then moves upward, such that a larger amount of residence time may be ensured, and trapping efficiency may be improved.

The flat trapping plates 53 are installed across central portions of the first trapping plates 51 and central portions of the second trapping plates 52 in the width direction, such that the unreacted gas moved upward after passing through the gas movement portions 511 and the gas movement portions 521 generates vortices again while moving in the horizontal direction and moving along the extended flow paths on the surfaces, thereby allowing a larger number of reaction by-products to move and rise in a zigzag manner while being trapped in the form of powder under a low-temperature environment.

Meanwhile, the flat trapping plate 53 positioned at the uppermost end includes an additional plurality of flat trapping plates 53, thereby allowing the unreacted gas to generate multiple vortices, improve the trapping efficiency, and then move to the flow path switching plate 6.

The first trapping plates 51 and the second trapping plates 52, which are stacked and spaced apart from one another at predetermined intervals in the vertical direction, have, at multiple points, fastening holes 54 and rod-shaped fastening portions 55 penetrating the fastening holes 54 in the vertical direction. The fastening holes 54 and the rod-shaped fastening portions 55 are fastened to the support portions 13*a* formed on the lower plate of the housing.

The fastening portions 54 positioned at the respective points may be thread-fastened to the support portions by inserting the lower portions of the fastening portions 54 into the support portions. Various well-known fastening methods such as a fitting method or a welding method may of course be applied as an example of the fastening method.

The second internal trapping tower 5 configured as described above is positioned in the rear region of the trapping region division part 3 and configured to trap the reaction by-product, which is aggregated in the form of powder by reacting at a low temperature, from the reaction by-product mixtures contained in the unreacted gas introduced from the space region maintained at a temperature relatively lower than a temperature of the front region.

Figure 10:
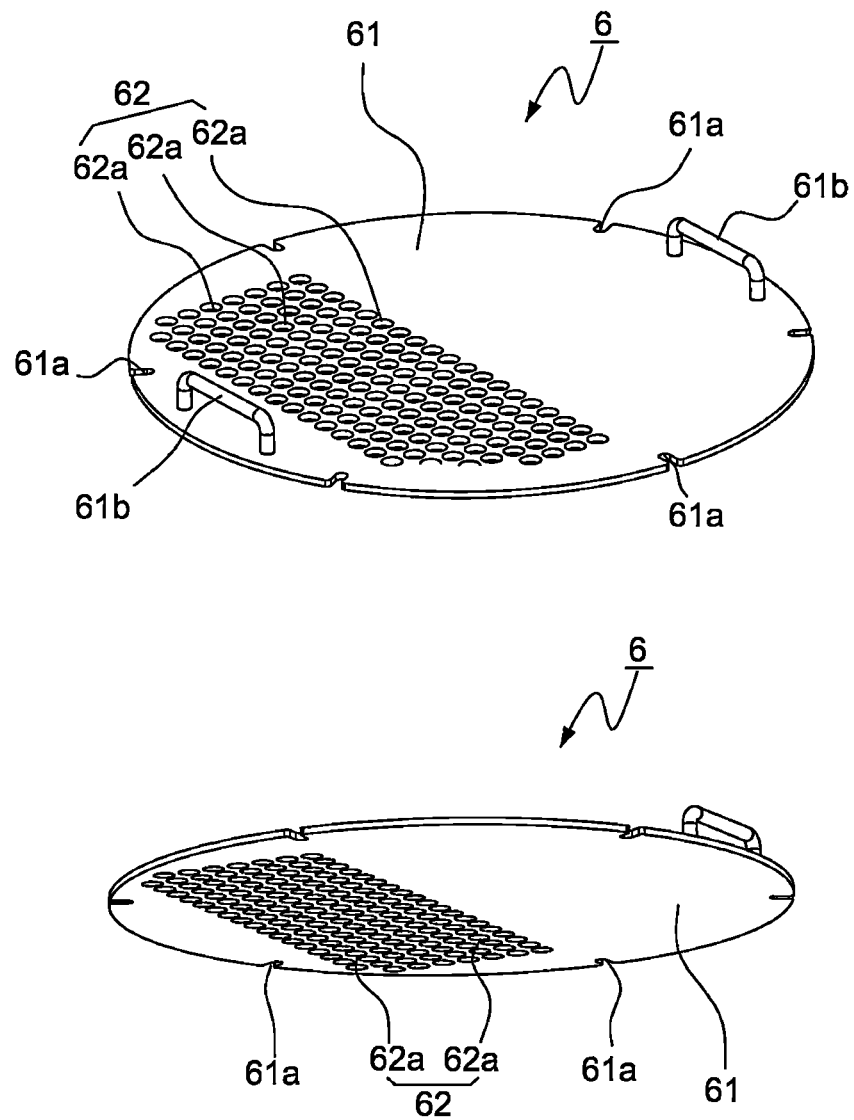
FIG. 10 is a perspective view illustrating a flow path switching plate according to the embodiment of the present disclosure.

FIG. 10 is a perspective view illustrating the flow path switching plate according to the embodiment of the present disclosure.

As illustrated, the flow path switching plate 6 includes: a plate main body 61 having a circular plate shape and configured to divide the internal space of the housing main body into an upper space and a lower space while maximally sealing the upper space and the lower space; and a gas movement portion 62 formed in one region of the plate main body and having plurality of holes 62*a* pierced to be used as a passageway for the unreacted gas.

In particular, an outer diameter of the plate main body 61 may most preferably correspond to the inner diameter of the housing main body. However, the outer diameter of the plate main body 61 may be closest to the inner diameter of the housing main body for assembly and installation.

In order to fix the plate main body, the plate main body is seated on the plurality of support pieces 11*b* installed along the inner wall of the housing main body 11, and bolts are inserted and fastened into fastening grooves 61*a* provided along a periphery of the plate main body. However, various well-known fastening methods including welding may be applied in addition to the aforementioned method.

In addition, handles 61*b* provided on an upper surface of the plate main body 61 may be used to insert the plate main body 61 into the housing.

The flow path switching plate 6 configured as described above is positioned at the upper side of the trapping region division part 3, and a portion of the plate main body 61, which has no gas movement portion 62, blocks the flow path of the unreacted gas moving upward via the second internal trapping tower 5 to switch the flow path direction, thereby guiding and discharging the unreacted gas upward through the gas movement portion 62 having the plurality of pierced holes 62*a*.

In this case, the flow path switching plate serves not only to switch the direction of the unreacted gas and extend the flow path, but also to traps again the remaining reaction by-product aggregated in the form of powder by reacting at a low temperature from the reaction by-product mixtures contained in the unreacted gas.

Figure 11:
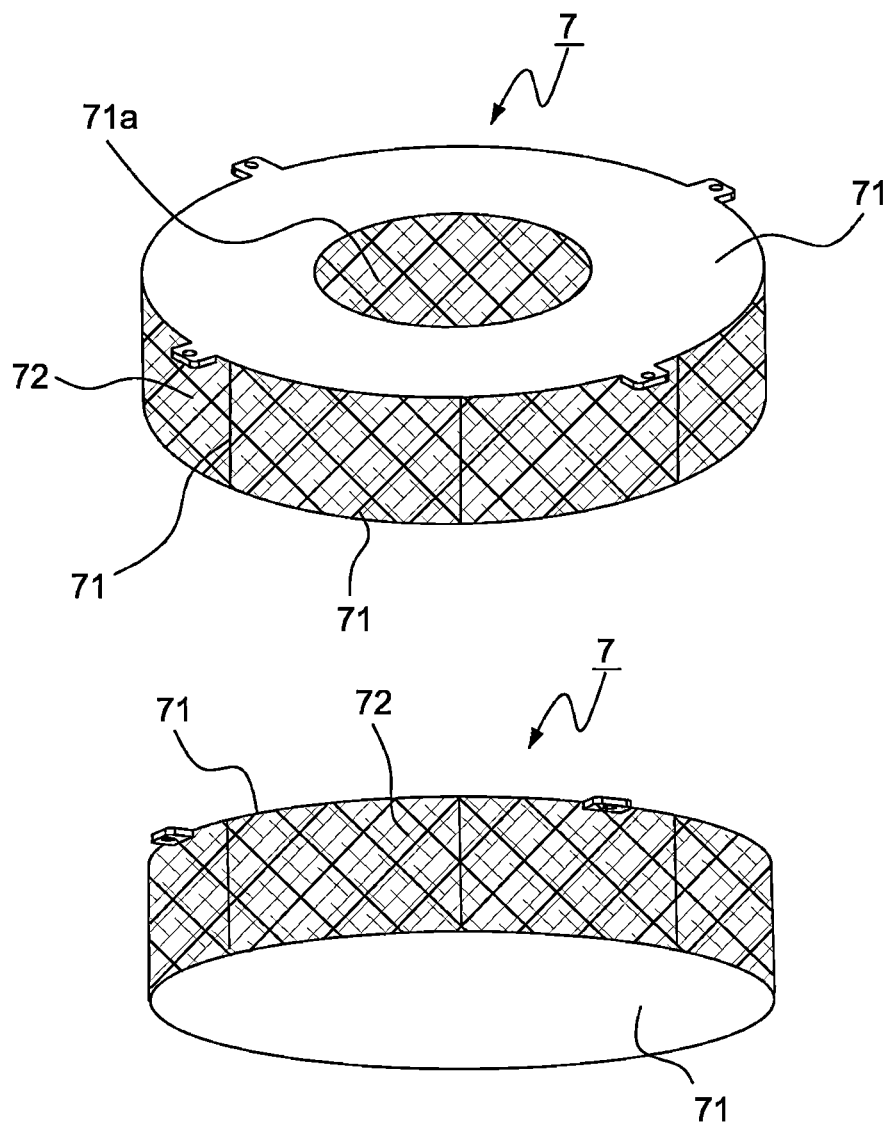
FIG. 11 is a perspective view illustrating a mesh-type trapping part according to the embodiment of the present disclosure.

FIG. 11 is a perspective view illustrating the mesh-type trapping part according to the embodiment of the present disclosure.

As illustrated, the mesh-type trapping part 7 includes: a main body 71 having a closed lower side, a lateral side having a mesh shape to allow the unreacted gas to be introduced thereinto, and an upper side having a mesh-shaped insertion portion 71*a* having a predetermined depth and formed only at a central portion, such that the hole-type gas guide part 12*b* protruding downward from the upper plate 12 of the housing is inserted into the mesh-shaped insertion portion 71a; and a mesh filter 72 accommodated in the main body and configured to trap the remaining reaction by-product, which is contained in the introduced unreacted gas, in the form of powder under a low-temperature condition.

A plurality of fasteners formed around an upper surface of the main body 71 may be fastened to the lower portion of the upper plate of the housing. Of course, the present disclosure is not limited by the above-mentioned method, and any one of various well-known fastening methods such as fitting, or welding may be used.

The mesh filter 72 is configured in a shape like mesh wool and allows the unreacted gas to move along complicated inner pores, thereby finely trapping the remaining reaction by-product again.

According to the mesh type trapping part 7 configured as described above, the unreacted gas discharged upward through one point region of the flow path switching plate 6 is introduced into the mesh filter 72 accommodated in the type trapping part 7 through the lateral side, and the mesh filter 72 traps the remaining reaction by-product aggregated in the form of powder by reacting at a low temperature from the reaction by-product mixtures contained in the unreacted gas. Then, only the unreacted gas is introduced into the hole-type gas guide part 12b through the mesh-shaped insertion portion 71a provided at the central portion and then discharged through the gas discharge port 12a of the upper plate 12 positioned at the upper side.

According to the apparatus for trapping multiple reaction by-products according to the present disclosure configured as described above, when the unreacted gas discharged from the process chamber is supplied into the housing main body 11 of the housing 1 in the transverse direction, the flow in the movement direction of the introduced unreacted gas is controlled to allow the unreacted gas heated by the hot/cold heater 2 to divide the trapping region, and the trapping region division part 3 for dividing the heat distribution region allows the reaction by-product, which is aggregated in the form of a thin film in a relatively high-temperature region, to be trapped while moving upward and downward through the first internal trapping tower 4 in the front region, and allows the reaction by-product, which is aggregated in the form of powder at a relatively low-temperature region, to be trapped while moving in a zigzag manner in the direction from the lower side to the upper side through the second internal trapping tower 5 in the rear region. Then, the remaining reaction by-product is finely trapped by the flow path extending from the flow path switching plate 6 and the mesh filter of the mesh type trapping part 7 and then be discharged.

Figure 12:
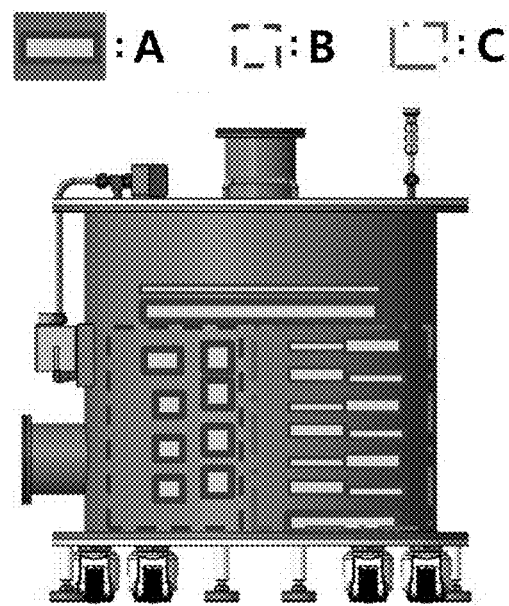
FIG. 12 is an exemplified view illustrating a trapping tendency in the reaction by-product trapping apparatus according to the embodiment of the present disclosure.
Figure 13:
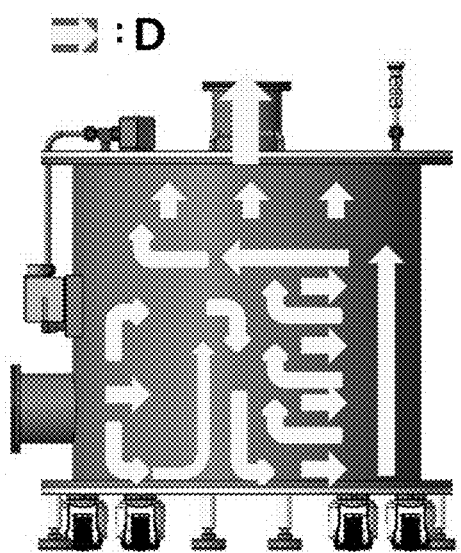
FIG. 13 is an exemplified view illustrating a gas flow in the reaction by-product trapping apparatus according to the embodiment of the present disclosure.

FIG. 12 is an exemplified view illustrating a trapping tendency in the reaction by-product trapping apparatus according to the embodiment of the present disclosure, and FIG. 13 is an exemplified view illustrating a gas flow in the reaction by-product trapping apparatus according to the embodiment of the present disclosure.

In FIG. 12, A indicates a reaction by-product trapping region, B indicates a region in which $Al_2O_3$ is mainly trapped among the reaction by-product mixture, and C indicates a region in which $TiO_2$ is mainly trapped among the reaction by-product mixture. In addition, in FIG. 13, D indicates a gas flow path. In addition, the description of the following components may be replaced with the description described with reference to FIGS. 1 to 11.

As illustrated, according to the apparatus for trapping multiple reaction by-products according to the present disclosure, the flow in the movement direction of the introduced unreacted gas is controlled to allow the unreacted gas introduced into the housing to divide the trapping region, and the trapping region division part 3 for dividing the heat distribution region allows the reaction by-product, which is aggregated in the form of a thin film in a relatively high-temperature region, to be trapped while moving upward and downward through the first internal trapping tower 4 in the front region, and allows the reaction by-product, which is aggregated in the form of powder at a relatively low-temperature region, to be trapped while moving in a zigzag manner in the direction from the lower side to the upper side through the second internal trapping tower 5 in the rear region.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping multiple reaction by-products for a semiconductor process, the apparatus being configured to trap a reaction by-product mixture contained in an unreacted gas discharged after multiple thin-film deposition processes are performed in a process chamber during a semiconductor manufacturing process, the apparatus comprising:

a trapping region division part (3) positioned in a housing (1) and configured to divide a heat distribution region by controlling a flow of the unreacted gas introduced and heated by a hot/cold heater (2);

a first internal trapping tower (4) positioned in a front region of the trapping region division part (3) and configured to trap the reaction by-product, which reacts at a relatively high temperature, in the form of a thin film from the reaction by-product mixtures contained in the introduced unreacted gas; and a second internal trapping tower (5) positioned in a rear region of the trapping region division part (3) and configured to trap the reaction by-product, which reacts at a relatively low temperature, in the form of powder from the reaction by-product mixtures contained in the introduced unreacted gas in a space region in which a relatively lower temperature is maintained than the front region, wherein the reaction by-product mixtures contained in the unreacted gas are separated and trapped by dividing the heat distribution region in a single apparatus into a high-temperature region and a low-temperature region.

2. The apparatus of claim 1, wherein the housing (1) comprises:

a housing main body (11) having a gas inlet port (11a) formed in a transverse direction and configured to accommodate the introduced unreacted gas;

an upper plate (12) having a gas discharge port (12a) installed in an upward direction and having a hole-type gas guide part (12b) protruding from a lower portion of the upper plate (12);

a lower plate (13) configured to fasten and support the trapping region division part (3), the first internal trapping tower (4), and the second internal trapping tower (5); and a coolant flow path part (14) installed on the upper plate (12) and configured to cool the upper plate and the housing to adjust outer surface temperatures of the upper plate and the housing.

3. The apparatus of claim 1, wherein the hot/cold heater (2) is configured such that an external coolant tube (14a) of the coolant flow path part (14) is connected to a lower coolant flow path (14b) that surrounds a periphery of a power tube (22) connected to a power supply part (21), such that a coolant performs thermal conduction while circulating to adjust an outer surface temperature of the housing.

4. The apparatus of claim 1, further comprising:
a flow path switching plate (6) positioned above the trapping region division part (3) and configured to trap the remaining reaction by-product contained in the unreacted gas by switching and extending a flow path direction of the gas have passed through the second internal trapping tower (5).

5. The apparatus of claim 4, further comprising:
a mesh type trapping part (7) configured to trap the remaining reaction by-product contained in the unreacted gas discharged upward through one point region of the flow path switching plate (6) and then discharge only the unreacted gas through a gas discharge port of an upper plate.

6. The apparatus of claim 1, wherein the trapping region division part (3) comprises:
a front blocking plate (31) configured to trap heat of the heated introduced unreacted gas and divide a reaction by-product trapping space by controlling a flow in a movement direction;
an upper blocking plate (32) configured to block an upward flow of the introduced unreacted gas by blocking an upper side of the front blocking plate; and
a gas movement portion (33) formed on a lower portion of the front blocking plate (31) and configured to guide a flow of the unreacted gas downward and discharge the unreacted gas.

7. The apparatus of claim 1, wherein the first internal trapping tower (4) comprises:
a first trapping plate (41) positioned at a front side; and
a second trapping plate (42) positioned at a point spaced apart from the first trapping plate (41) at a predetermined interval,
wherein the first trapping plate (41) and the second trapping plate (42) have one or more gas movement portions (411) and (421) having a plurality of holes (411a and 421a) pierced in surfaces thereof to guide a flow of the introduced unreacted gas upward and downward, and
wherein the first trapping plate (41) and the second trapping plate (42) have a plurality of structural trapping plates (412 and 422) protruding forward from the surfaces thereof.

8. The apparatus of claim 7, wherein the gas movement portions (411) are formed on upper, central, and lower portions of the first trapping plate (41), and the gas movement portion (421) is formed only on an upper portion of the second trapping plate (42) to guide the flow of the unreacted gas.

9. The apparatus of claim 7, wherein the first trapping plate (41) further comprises a plurality of structural trapping plates (412) protruding rearward from the surface thereof.

10. The apparatus of claim 7, wherein the structural trapping plates (412 and 422) each have a cross-shaped cross-section or a double-cross-shaped cross-section.

11. The apparatus of claim 1, wherein the second internal trapping tower (5) comprises:
a first trapping plate (51) having a semicircle plate shape and having a gas movement portion (511) having a plurality of holes (511a) pierced in one rear end region;
a second trapping plate (52) having a semicircle plate shape and having a gas movement portion (521) having a plurality of holes (521a) pierced in one front end region; and
a flat trapping plate (53) installed between the first trapping plate (51) and the second trapping plate (52) stacked in an upward direction to allow the first trapping plate (51) and the second trapping plate (52) to be spaced apart from each other at a predetermined interval in a vertical direction and having a plurality of holes (53a) formed in a surface thereof, and
wherein the second internal trapping tower (5) is configured to trap the reaction by-product while switching a flow of the unreacted gas to the upward direction in a zigzag direction.

12. The apparatus of claim 11, wherein the second internal trapping tower (5) is configured such that the first trapping plate (51) is positioned at a lowermost end, and the second trapping plate (52) is positioned at an uppermost end to extend a flow path of the introduced unreacted gas,
wherein the flat trapping plate (53) is installed across a central portion of the first trapping plate (51) and a central portion of the second trapping plate (52) in a width direction, and
wherein the flat trapping plate (53) positioned at the uppermost end is provided in plural.

13. The apparatus of claim 4, wherein the flow path switching plate (6) comprises:
a plate main body (61) having a circular plate shape and configured to divide an internal space of a housing main body into an upper space and a lower space; and
a gas movement portion (62) formed in one region of the plate main body and having a plurality of pierced holes (62a) used as a passageway for the unreacted gas.

14. The apparatus of claim 5, wherein the mesh type trapping part (7) comprises:
a main body (71) having a closed lower side, a lateral side having a mesh shape to allow the unreacted gas to be introduced thereinto, and an upper side having a mesh-shaped insertion portion (71a) having a predetermined depth and formed only at a central portion, such that the hole-type gas guide part (12b) protruding downward from the upper plate (12) of the housing is inserted into the mesh-shaped insertion portion (71a); and
a mesh filter (72) accommodated in the main body and configured to trap the remaining reaction by-product, which is contained in the introduced unreacted gas, in the form of powder under a low-temperature condition.

* * * * *